United States Patent [19]

Drescher et al.

[11] 4,283,620

[45] Aug. 11, 1981

[54] ARRANGEMENT FOR DETERMINING THE LENGTH OF ARBITRARY SHIFT REGISTERS

[75] Inventors: Heinz Drescher, Holzgerlingen; Heinrich Imbusch, Mainz; Hans H. Lampe, Herrenberg, all of Fed. Rep. of Germany

[73] Assignee: International Business Machines Corporation, Armonk, N.Y.

[21] Appl. No.: 54,327

[22] Filed: Jul. 2, 1979

[30] Foreign Application Priority Data

Sep. 14, 1978 [DE] Fed. Rep. of Germany ....... 2839950

[51] Int. Cl.³ .................................................. G01R 31/26
[52] U.S. Cl. .......................... 235/92 SH; 307/221 R; 328/37; 357/24; 364/900; 365/78; 365/240; 371/27
[58] Field of Search ... 364/200 MS File, 900 MS File; 371/27, 21; 307/221 R, 221 D; 365/78, 240; 324/210, 73 R; 235/92 SH; 328/37; 29/574; 357/24

[56] References Cited

U.S. PATENT DOCUMENTS

| | | | |
|---|---|---|---|
| 3,790,888 | 2/1974 | James | 371/27 |
| 3,805,152 | 4/1974 | Ebersman et al. | 371/21 |
| 3,815,025 | 6/1974 | Jordan | 371/27 |
| 3,924,144 | 12/1975 | Hadamard | 307/221 R |
| 3,987,311 | 10/1976 | Thornburg | 307/221 R |
| 4,001,673 | 1/1977 | Barrett et al. | 324/210 |
| 4,099,048 | 7/1978 | Eichenlaub | 235/92 SH |

*Primary Examiner*—Joseph M. Thesz
*Assistant Examiner*—C. T. Bartz
*Attorney, Agent, or Firm*—Saul A. Seinberg

[57] ABSTRACT

A diagnostic arrangement is disclosed for determining the length of arbitrary shift registers not exceeding a maximum length. Knowledge of this length is an essential prerequisite for data manipulations by means of shift registers. Concerned are the reading of shift registers and the display of the contents stored in them, as well as the writing of arbitrarily selectable patterns into said shift registers.

The arrangement proper includes circuitry connected to the shift register or test object for generating a test shift pattern of the length $L_{max}+K$, with $K \geq 2$, which pattern is made up of a defined bit configuration, for example, only binary ones, with a defined transition at the end facing the test object and which is shifted through the test object. Also provided is storage means of length $L_{max}+K$, which is connected to the output of the test object and which, as the test shift pattern is shifted, accommodates the information of the length $L_x$ of the test object and the part $L_{max}+K-L_x$ of the test shift pattern. The arrangement also includes a display means, whose individual fields are associated with one storage cell each of the storage means, so that its contents can be displayed and thus the data transition, for example, from zero to one, indicating the end of the shift register of unknown length, can be determined. From the subsequently determinable beginning and end of the shift register of unknown length, its actual length can be derived.

19 Claims, 8 Drawing Figures

ARRANGEMENT FOR DETERMINING THE LENGTH OF ARBITRARY SHIFT REGISTERS

BACKGROUND OF THE INVENTION

1. Field of the Invention

This invention relates to an arrangement for determining the length of shift registers and, more particularly, to an arrangement adapted to make such a determination where the shift register is of an unknown, arbitrary length not exceeding a known maximum in connection with the testing of large scale integrated chip logic circuitry.

2. Description of the Prior Art

For the precise execution of write and read operations of shift registers, it is necessary to know the exact length of such shift registers. The use of shift registers is sufficiently known and has played an increasingly important role in connection with the testability of logic circuits produced at maximum integration density on semiconductor chips (LSI chips).

The inputs and outputs of such logic circuits are in each case connected to latch circuits in which their input and output information can be stored. Because of the notorious lack of connections to the outside world, such input and output latch circuits are connected in the form of shift registers on a semiconductor chip, whereby one such latch circuit forms one stage of a shift register. The number of latch circuits on a particular semiconductor chip, and thus the length of the shift register, differ greatly and are not subject to any law.

During normal operation of the circuits on the semiconductor chip, the input and output latch circuits are, as a rule, not connected in the form of shift registers; this being generally the case only during testing. Thus, a shift register tool permitting arbitrary manipulations of such shift registers is needed both for testing newly developed circuits and for error searching installed systems. Essentially, two basic functions are required; reading of shift registers and displaying the contents stored in them and writing (or setting) freely selectable patterns into such shift registers.

As it is a prerequisite of such shift register manipulations to know the length of the shift register, it has to be indicated either before shifting how long the shift register is or fixed lengths for particular shift registers have to be provided in the shift register tool. Whereas the former approach, in addition to being inconvenient, entails the risk of faulty operation, the latter approach necessitates that each change in the length of a shift register be accompanied by a simultaneous change of the shift register tool. The disadvantage of this is an extraordinary degree of inflexibility in the case of the above-mentioned applications, for which, as is known, shift registers of unknown and considerably differing lengths are formed on various semiconductor chips.

OBJECTS AND SUMMARY OF THE INVENTION

Therefore, it is the object of the present invention to provide a shift register tool which permits shift registers of arbitrary lengths to be both read and written.

Thus, the present invention offers the essential advantage that, as a result of the proposed automatic determination of the lengths of unknown shift registers, a universally applicable shift register tool is thereby obtained which is particularly suitable for testing highly integrated circuits having shift register lengths of various and unknown sizes.

This object is satisfied by providing an arrangement for determining the unknown length $L_x$ of arbitrary shift registers or test objects not exceeding a predetermined maximum length $L_{max}$. Circuit means are provided, connected to the input of the test object, for generating a test shift pattern of length $L_{max}+K$, where K is $\geq 2$. The test shift pattern consists of a defined bit configuration (e.g., only binary ones) having a defined data translation at its end facing the test object. This defined bit configuration is then shifted through the test object.

A storage means of length $L_{max}+K$ is connected to the output of the test object and accommodates the information of length $L_x$ of the test object and the portion $L_{max}+K-L_x$ of the test shift pattern as it is shifted. Also provided is display means, the individual cells of which are permanently associated with one storage cell each of the storage means for indicating the contents of each storage cell so that the data transition and thus the end and the length $L_x$ of the test object can be visually determined.

These features and other advantageous embodiments, as well as further aspects of the subject matter of the present invention may be seen from the accompanying drawings, the following description and the appended claims.

DESCRIPTION OF THE PREFERRED EMBODIMENT

Figure 1:
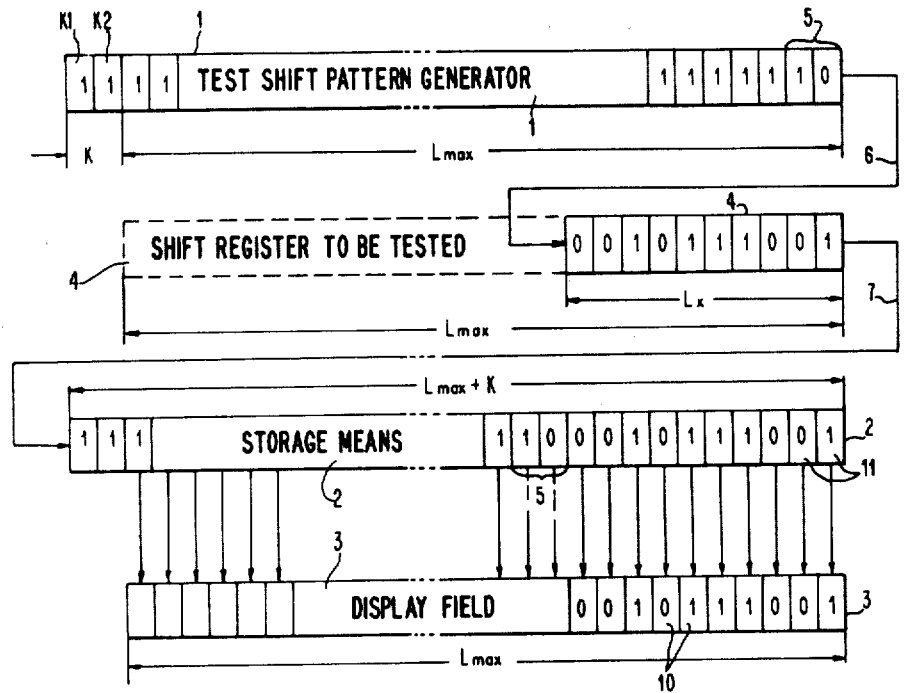
FIG. 1 is a representation of the principle for reading shift registers of unknown lengths.

FIG. 1 shows the principle of an arrangement which permits shift registers of arbitrary unknown lengths to be both read and written. A systematic examination of the write processes in such shift registers essentially yields the following three modes:

(A) The length of the pattern to be written concurs exactly with the length of the shift register, this being the simplest case which requires no additional measures;

(B) The pattern to be written is longer than the shift register, in which case it is to be indicated how far the pattern could be written; and (C) The pattern to be written is shorter than the shift register, in which case, writing can be prevented or, alternatively, the shorter pattern can be supplemented by a homogeneous pattern.

The reading of shift registers of unknown lengths and the determination of the respective lengths are also subject to the aforementioned difficulties. These difficulties can be solved, however, by means of the principle shown in FIG. 1.

For the arrangement of FIG. 1, it is assumed that the shift registers 4 of the unknown length $L_x$, by means of which and on which manipulations are to be carried out, have finite lengths. It is also assumed that the maximum unknown length $L_{max}$ of these shift registers is not exceeded. In the shift register tool of FIG. 1, an arrangement 1 is provided which generates a test shift pattern of the length $L_{max}+K$, where $K \geq 2$. As arrangement 1, a shift register of the length $L_{max}+K$ can be used, for example.

The test shift pattern is homogeneous except for the transition 5 at the right-hand end of the arrangement 1. If the homogeneous pattern consists only of ones, then the transition is a transition from one to zero, so that the binary zero is in the right-most position of the shift register. In principle, it is also possible to use only ones as a homogeneous pattern, whereby the transistion 5 is realized in such a manner that the right-most position contains a binary one.

Figure 2:
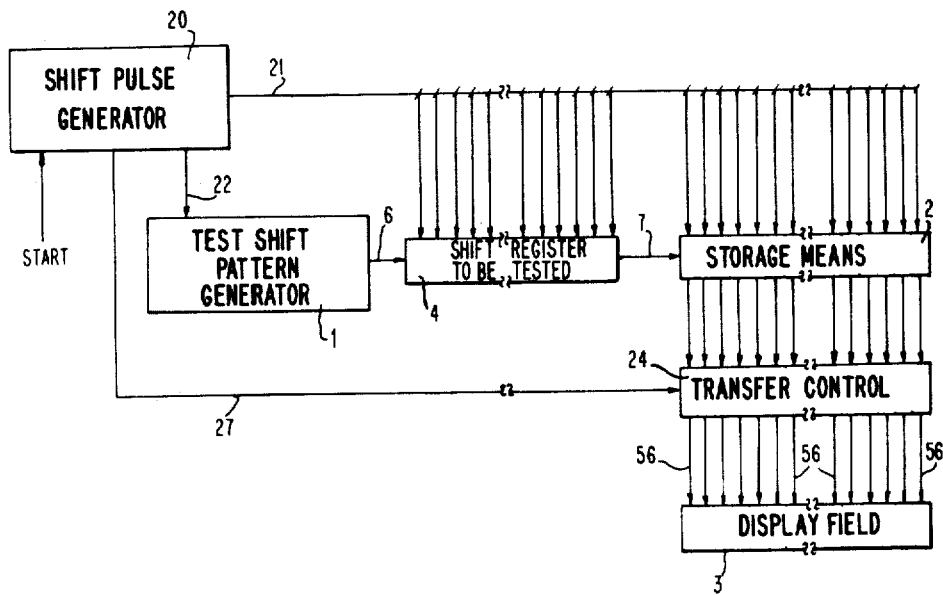
FIG. 2 is a block diagram of a control for reading and writing shift registers of unknown lengths.
Figure 3:
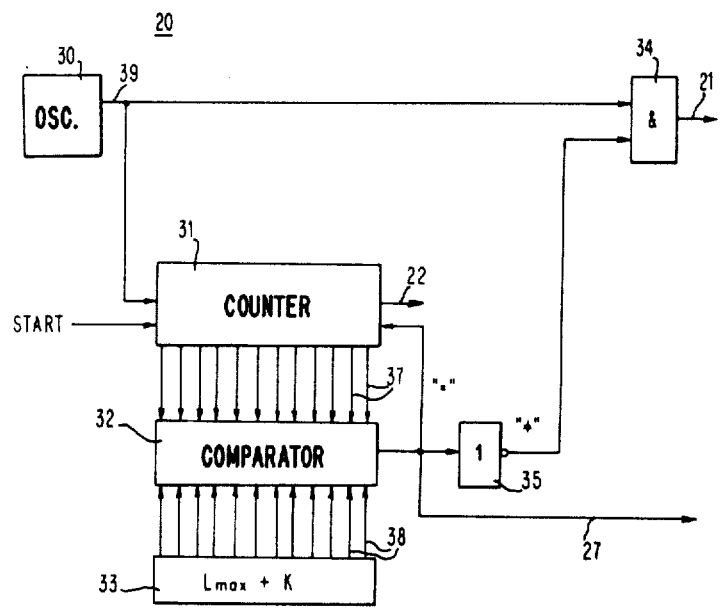
FIG. 3 is the block diagram of a shift pulse generator.

By applying shift pulses via a shift line, now shown in FIG. 1, the contents of the shift register 4 of unknown length are transferred via the data line 7 to the storage 2 which is possibly also a shift register. Then the storage 2 is filled from the left with the test shift pattern which reaches the storage 2 through the shift register 4 by applying shift pulses via the line 6. The length of this storage 2 is also $L_{max}+K$. The number of shift pulses generated by a shift pulse generator 20 in FIGS. 2 and 3 is chosen to be $L_{max}+K$, thus ensuring that the full contents of the unknown shift register 4 and a part of the test shift pattern reach the storage 2. The size of this part of the test shift pattern can be specified to be $L_{max}+K-L_x$.

Subsequently, the data transition 5 in storage 2 is searched from left to right. One position to the right from this transition, depending upon the direction of view, there is the first or the last bit of the data contents of the unknown shift register 4.

As the beginning of the storage 2 is known, the contents of the unknown shift register 4 can be accommodated in the appropriate length in the display field 3.

In the case of a shift register which is open (on the left), conditions are particularly difficult, although the arrangement of FIG. 1 automatically fills such an open shift register with a homogeneous pattern of binary zeros or ones, depending upon whether the logic circuits (AND or NAND) used at the (left) open end for realizing the shift register cells are positive or negative logic circuits.

However, the length of an open shift register cannot be determined, since the bits on the left in the shift register may have the same value as the test shift pattern. Thus, it is indispensable for length determinations to shift into the unknown shift register the test shift pattern with an identifiable transition in the data configuration.

The arrangement shown in FIG. 1 also permits error checking unknown shift registers. If a transition 5 or a part of the test shift pattern cannot be found when storage 2 is searched, the unknown shift register is certain to be defective.

The arrangement of FIG. 1 also permits the writing of shift registers of unknown lengths and error checking the write process.

For this purpose, the length $L_x$ of the unknown shift register is initially determined in the manner previously explained. Then the predetermined pattern is written into the shift register 4 up to the predetermined length. Subsequently, it is marked in the predetermined pattern up to which position the pattern could be written into shift register 4.

During checking, the written pattern is read from the shift register 4 and compared with the predetermined pattern. In the case of deviations, the positions concerned are marked.

For shift register manipulations of a data processing system comprising a console and a screen, the screen can be used as a display field 3. For this purpose the bit patterns can be represented with ones and zeros as needed. Shift register end positions can be marked by an asterisk (*), erroneously written bits by a plus sign (+) for an additional bit or by a minus sign (−) for a missing bit. The individual fields 10 of the display field 3 are each permanently associated with one storage cell 11 of the storage means 2 and would thus indicate the contents of thereof.

As indicated when the principle was explained above by means of FIG. 1, the contents of the test object, i.e., of the shift register 4 of unknown length, are to be displayed by means of the display field 3 which from the standpoint of its principle is a result storage. The test object proper, as well as the storage 2, which acts as an auxiliary storage, are standard shift registers, whose stages 11 (FIG. 1) take the form of latch circuits or flip-flops.

The shift pulses necessary for shifting and amounting to $L_{max}+K$ are generated in the arrangement of FIG. 2 by means of shift pulse generator 20 and are transferred via line 21 both to the test object 4 and the storage 2.

The test shift pattern generator 1 generates the test shift pattern, transferring the same to the test object 4 via line 6. For generating the test shift pattern, the test shift pattern generator 1 requires a signal designated as step "1", which via line 22 is transferred from the shift pulse generator 20 to the test shift pattern generator 1.

After completion of the shift process, a transfer control 24, controlled by a transfer pulse applied by the shift pulse generator 20 to the transfer control 24 via line 27, causes the contents of the test object 4 (and only those) in storage 2 to be transferred via lines 56 to the display field 3, using the transfer elements 60, 70, 80 (FIG. 5) contained in the transfer control 24.

The operation of the arrangement shown in FIG. 2 will be explained in greater detail in the subsequent description of the shift pulse generator 20, the test shift pattern generator 1, and the transfer control 24. As shown in FIG. 3, the shift pulse generator 20 comprises an oscillator 30 transferring rectangular pulses of a suitable clock frequency to one of two inputs of the AND gate 34 via line 39. If this AND gate 34 is open, it emits via its output line 21, the shift pulses for shifting the information contained in the test object 4 and the storage 2.

The number $L_{max}+K$ of the shift pulses is determined by means of a counter 31 with an associated comparator 32. At the beginning of the operation, the start signal sets the counter 31 to the initial value zero. Subsequently, via line 39, said counter 31 is incremented by the pulses of the oscillator, which, as previously mentioned, also represent the shift pulses. The comparator 32, connected to the counter stages via the lines 37, continually compares the respective count with the constant value $L_{max}+K$ in storage 33, of which it is notified via the lines 38.

As soon as the maximum count $L_{max}+K$ has been reached, the output pulse transferred to the negator 35 via the line 27 is inverted, so that this inverted output signal, representing the second input of the AND gate, blocks said gate. This also means the end of the shift pulse transmission from oscillator 30 via the line 21. Simultaneously, the output pulse of the comparator 32, which is transferred as a transfer pulse via the line 27, triggers the transfer control 24.

Finally, the output signal of the comparator, which is generated at the count $L_{max}+K$, is transferred to the counter 31 via the line 27, in order to prevent the latter from being incremented further.

Figure 4:
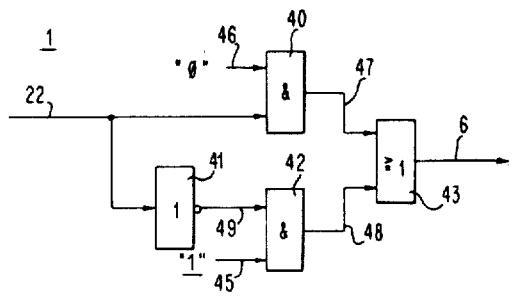
FIG. 4 is the block diagram of a test shift pattern generator.

By means of the signal "step one", which is transferred via the line 22 from the first stage of the counter 31 in FIG. 3, the test shift pattern generator 1, of FIG. 4 generates for the first shift step, with the aid of the AND gate 40, the transfer line 47, and the OR gate 43, the zero bit of the test shift pattern, which is transferred to the test object 4 via the line 6.

For all further shift steps, the one bits of the test shift pattern, which are generated via the negator 41, the AND gate 42, the transfer line 48, and the OR gate 43, are transferred via the line 6.

For the generation of the zero bits of the test shift pattern by means of the AND gate 40, it is decisive that the level associated with a binary zero is constantly available on its input 46. Analogously, the presence of a level corresponding to a binary one on the input 45 of AND gate 42 is decisive for generating the one bits.

By permanent wiring, for example, said levels can be adjusted to be constant. Such adjustment can also be effected via a special control circuit, not shown, which selectively serves to emit the homogeneous bits of the test shift pattern as zeros or ones whereby for realizing the transition, the right-most bit position of the shift pattern must have an inverse binary value.

Thus, the shift pulse generator 20 and the test shift pattern generator 1 generate the shift pulses and the test shift pattern which are necessary for transferring the information of the test object 4 to the storage 2 (auxiliary storage).

Figure 5:
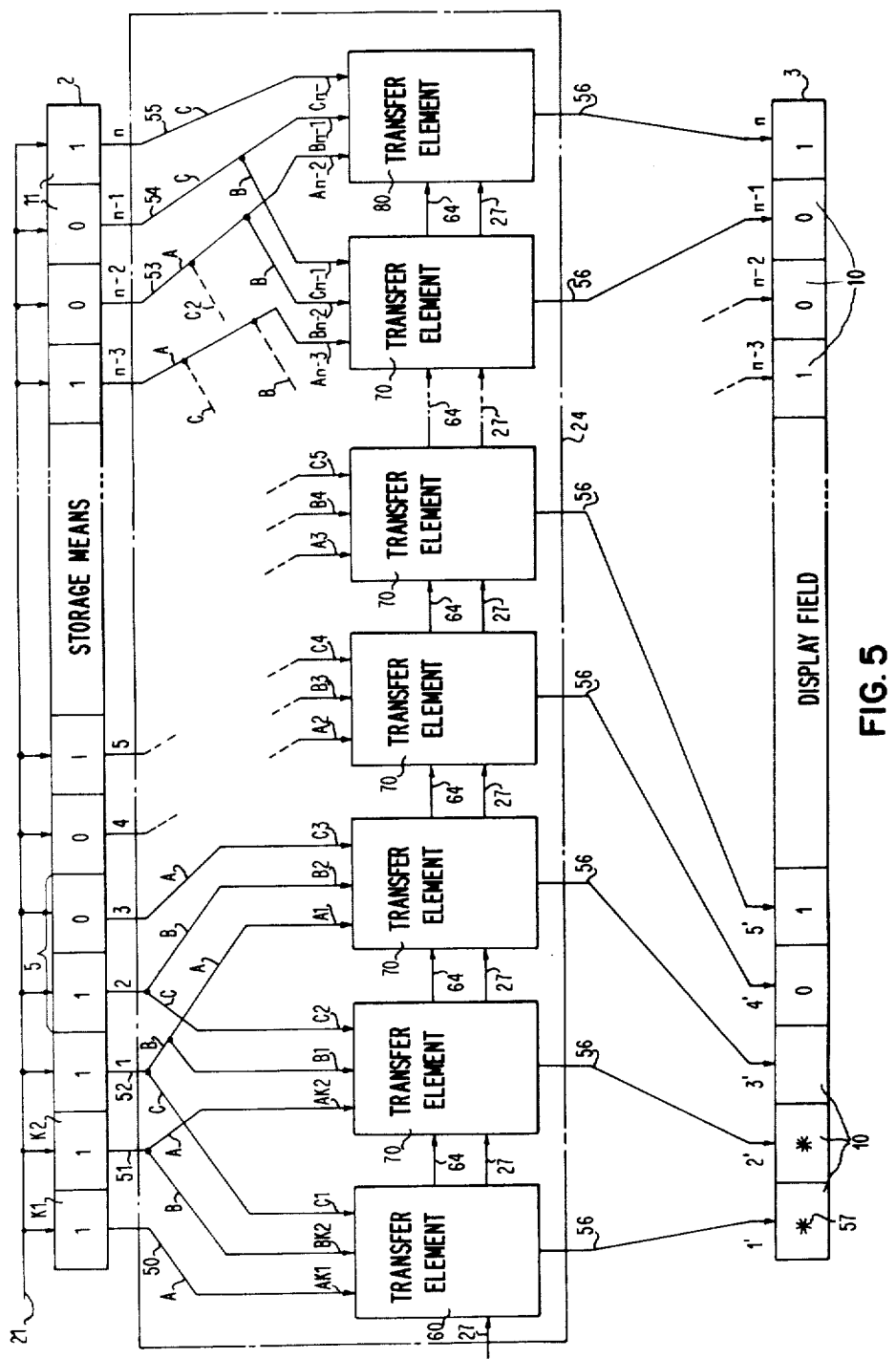
FIG. 5 is the block diagram of a transfer control.
Figure 6:
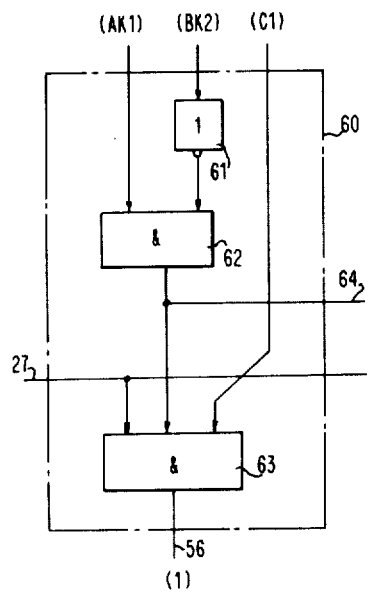
FIGS. 6 to 8 are block diagrams of transfer elements used in the transfer control of FIG. 5.

For transferring the bit pattern contained in storage 2, which consists of the bit pattern of the test object and a part of the test shift pattern, to the display field 3, the transfer control 24 illustrated in detail in FIG. 5 is used. Transfer control 24 suppresses the data transition 5 and the rest of the test shift pattern so that these are not displayed.

This transfer control 24 consists of a transfer element 60, whose design is different from that of the plurality of the transfer elements 70 and which is associated with position 1 of the storage 2 as well as of the display field 3, and which is interconnected between the two storage cells of said position, as well as of transfer elements 70 which are associated with the respective positions 2' to n−1, and finally of a component 80, whose design also differs from that of the transfer elements 70 and which is interconnected between the storage cell and the display field of the last position n. For the sake of completeness it is pointed out that in this case $L_{max}=n$.

The transfer elements 69, 70 and 80 determine from left to right the first data transition which is illustrated, for example, in FIG. 1 and which has the configuration 1/0. If one of these circuits identifies such a transition, it notifies all transfer elements further to the right, in order to transfer the stored contents of the test object from the storage 2 to the display field 3.

Figure 7:
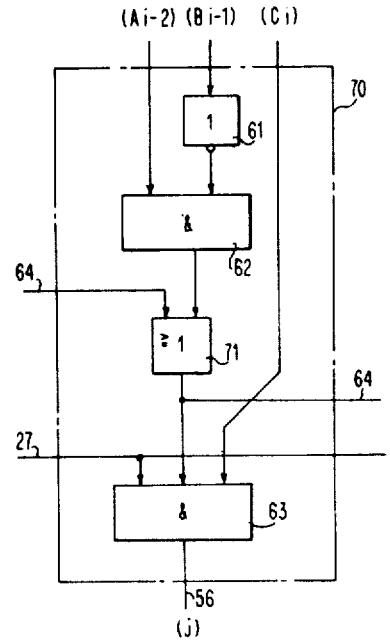
Figure 8:
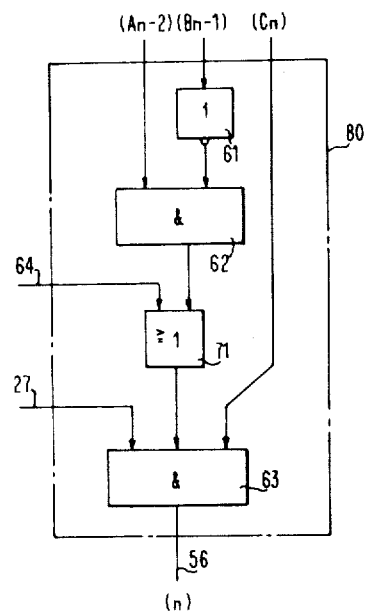

The function of the transfer elements will be explained by means of a transfer element 70 shown in FIG. 7. At an input $Ai-2=1$ and an input $Bi-1=0$, i.e., in the case of a data transition, the OR gate 71 is activated via the negator 61 and the AND gate 62.

Furthermore, the respective bit of position i in storage 2 is transferred, via the AND gate 63, to position i in the display field 3, if, in addition, the transfer pulse generated by the shift pulse generator 20 is present on line 27.

Detection of the 1/0 transition in the positions $i-2$ and $i-1$ is conveyed to the transfer elements for the positions $>i$ via the output line 64, so that, independently of the AND gates 62 of the transfer elements 70 or 80 on the right, their OR gates 71 are switched by the control signal on line 64. In this manner, the information from the positions i to n of the storage 2 reaches the positions i to n of the display field 3 at a time when the transfer pulse is emitted via the line 27.

For detection from left to right of the 1/0 transition, there are output lines of the storage 2, which, depending upon the position, are connected as single, double, or triple lines. The single lines are designated as A, the double lines as A and B, and the triple lines as A, B, and C. The systematic structure of this system is such that the first stage K1 of the storage has only one single line A; the second stage K2 has one double line A, B; the third stage 1 up to the last but 2 stages $n-2$ triple lines A, B, and C; the last, but one stage one double line B and C; and the last stage n, only one single line C.

The stages K1 and K2 complying with the condition $K \geq 2$ serve to ensure, proceeding from an admissible maximum length $L_{max}$, that data transition can still be reliably identified for which two additional positions of 1 and 0 are sufficient.

Thus, for a test object 4 of non-erroneous length $L_{max}=n$, stage K2 must contain a binary zero and stage K1 a binary one. If such transition cannot be detected in the data configuration on the left adjacent to the first stage of the storage 2, this can be indicated by an error signal in an error circuit, not shown, connected to the lines AK1 and BK2.

To readily diagnose shift registers of unknown lengths, i.e., test objects 4, the transfer elements 60, 70, and 80 can be provided with circuit means, not shown, in order to write or optically display on the left in display field 3, an asterisk or other suitable symbol.

While the present invention has been described in the context of a preferred embodiment thereof, it will be readily apparent to those skilled in the art, that modifications and variations can be made therein without departing from the spirit and scope of the present invention. Accordingly, it is not intended that the present invention be limited to the specifics of the foregoing description of the preferred embodiment, but rather as being limited only by the scope of the invention as defined in the claims appended hereto.

Having thus described our invention, what we claim as new, and desire to secure by Letters Patent is:

1. An arrangement to aid in determining the unknown length $L_x$ of a shift register not exceeding a predetermined maximum length $L_{max}$, said arrangement including:

(a) circuit means, connected to the input of a shift register whose length $L_x$ is to be determined, for generating a test shift pattern of length $L_{max}+K$, with $K \geq 2$, which pattern comprises a defined homogeneous bit configuration having a defined data transition at the end thereof, and for shifting said test shift pattern into the shift register;

(b) storage means of length $L_{max}+K$ having $L_{max}+K$ individual cells, connected to the output of the shift register whose length is to be determined, for accommodating information as it emerges therefrom by storing said information of the length $L_x$ of the shift register and portion $L_{max}+K-L_x$ of the shift pattern; and (c) display means having individual fields permanently associated with one storage cell each of said storage means and operatively coupled thereto for displaying the contents of said storage cells so that said data transition and the length $L_x$ of the shift register can be displayed for determination.

2. The arrangement according to claim 1 which further includes transfer control means connected between said storage and said display means for transferring only the contents of the shift register to said display means from said storage means and for suppressing the test shift pattern including the data transition.

3. The arrangement according to claim 2 wherein said circuit means further includes a shift pulse generator operatively coupled to said circuit means and to said storage means for controlling the shifting of said test shift pattern and a portion thereof into the shift register and for controlling the shifting of the information stored in the shift register into said storage means, said shift pulse generator comprising:

(a) an oscillator for generating shift pulses;

(b) and AND gate connected between the output of said oscillator and the input of the shift register for applying shift pulses thereto;

(c) a counter having a least $L_{max}+K$ count positions connected to said oscillator and incremented by said shift pulses, said counter emitting an output signal indicative of the first count thereof;

(d) a comparator operatively coupled to said counter, said AND gate and said transfer control means which emits a transfer control signal when the count value $L_{max}+K$ is reached, which signal stops said counter, blocks said AND gate against the transfer of further shift pulses and enables said transfer control means.

4. The arrangement according to claim 3 wherein said circuit means for generating said test shift pattern includes:

(a) a first AND gate having one of its input held permanently at a binary zero and its other input adapted to receive said first count signal from said counter;

(b) a first inverter for logically inverting said first count signal;

(c) a second AND gate having one of its inputs held permanently at a binary one and its other input adapted to receive said inverted first count signal; and (d) an OR gate, the inputs of which are connected respectively to the outputs of said first and second AND gates, the output of which emits said test shift pattern.

5. The arrangement according to claim 4 wherein said transfer control means includes a transfer element for each individual cell of said storage means, said transfer element being adapted upon receipt of said transfer control signal to transfer the value resident in a particular storage means cell i therefrom to said corresponding position i in said display means if the value associated with it is in a position i-p to the right of said data transition, where the value p is an integer between K and n+K and the value n is an intefer equal to $L_{max}$.

6. The arrangement according to claim 5 wherein said transfer element associated with the first display means position has three input lines associated respectively with the first three storage means cells, the first of which is connected to the input of a third AND gate, the second of which is connected to the input of a second inverter whose output is connected to the other input of said third AND gate, and the third of which is connected to an input of a fourth AND gate, the other inputs of said fourth AND gates being connected respectively to the output of said third AND gate and to receive said transfer control signal, the output of said fourth AND gate being connected to the first display means position and the output of said third AND gate being also connected to an output line for communication with the remainder of said transfer elements whereby said transfer elements are notified of the presence of a data transition detected by said third AND gate, which transition causes the third input line to transfer information associated with its corresponding storage means cell to the corresponding display means position if this position is on the right of a data transition.

7. The arrangement according to claim 6 wherein all of the others of said transport elements have three input lines each which are associated respectively with succeeding storage means cells and which transfer elements are each interconnected to third and fourth AND gates in an identical manner to said first transfer element and which further includes an OR gate, associated with each of said other transfer elements, one input of which is connected to said output line of said third AND gate associated with the preceding transfer element and the other input of which is connected to the output of its own associated third AND gate and the output of which is connected to an input of its own associated fourth AND gate and to an input of the third AND gate of the immediate succeeding transfer element.

8. The arrangement according to claim 2 wherein said circuit means further includes a shift pulse generator operatively coupled to said circuit means and to said storage means for controlling the shifting of said test shift pattern and a portion thereof into the shift register and for controlling the shifting of the information stored in the shift register into said storage means, said shift pulse generator comprising:

(a) an oscillator for generating shift pulses;

(b) an AND gate connected between the output of said oscillator and the input of the shift register for applying shift pulses thereto;

(c) a counter having at least $L_{max}+K$ count positions connected to said oscillator and incremented by said shift pulses, said counter emitting an output signal indicative of the first count thereof;

(d) a comparator operatively coupled to said counter, said AND gate and said transfer control means which emits a transfer control signal when the count value $L_{max}+K$ is reached, which signal stops said counter, blocks said AND gate against the transfer of further shift pulses and enables said transfer control means.

9. The arrangement according to claim 8 wherein said circuit means for generating said test shift pattern includes:

(a) a first AND gate having one of its input held permanently at a binary zero and its other input adapted to receive said first count signal from said counter;

(b) a first inverter for logically inverting said first count signal;

(c) a second AND gate having one of its inputs held permanently at a binary one and its other input adapted to receive said inverted first count signal; and (d) an OR gate, the inputs of which are connected respectively to the outputs of said first and second AND gates, the output of which emits said test shift pattern.

10. The arrangement according to claim 9 wherein said transfer control means includes a transfer element for each individual cell of said storage means, said transfer element being adapted upon receipt of said transfer control signal to transfer the value resident in a particular storage means cell i therefrom to said corresponding position i in said display means if the value associated with it is in a position i-p to the right of said data transition, where the value p is an integer between K and n+K and the value n is an integer equal to $L_{max}$.

11. The arrangement according to claim 10 wherein said transfer element associated with the first display means position has three input lines associated respectively with the first three storage means positions, the first of which is connected to the input of a third AND gate, the second of which is connected to the input of a second inverter whose output is connected to the other input of said third AND gate, and the third of which is connected to an input of a fourth AND gate, the other inputs of said fourth AND gates being connected respectively to the output of said third AND gate and to receive said transfer control signal, the output of said fourth AND gate being connected to the first display means position and the output of said third AND gate being also connected to an output line for communication with the remainder of said transfer elements whereby said transfer elements are notified of the presence of a data transition detected by said third AND gate, which transition causes the third input line to transfer information associated with its corresponding storage means position to the corresponding display means position if this position is on the right of a data transition.

12. The arrangement according to claim 11 wherein all of the others of said transfer elements have three input lines each which are associated respectively with succeeding storage means positions and which transfer elements are each interconnected to third and fourth AND gates in an identical manner to said first transfer element and which further includes an OR gate, associated with each of said other transfer elements, one input of which is connected to said output line of said third AND gate associated with the preceding transfer element and the other input of which is connected to the output of its own associated third AND gate and the output of which is connected to an input of its own associated fourth AND gate and to an input of the third AND gate of the immediate succeeding transfer element.

13. The arrangement according to claim 2 wherein said circuit means for generating said test shift pattern includes:

(a) a first AND gate having one of its input held permanently at a binary zero and its other input adapted to receive said first count signal from said counter;

(b) a first inverter for logically inverting said first count signal;

(c) a second AND gate having one of its inputs held permanently at a binary one and its other input adapted to receive said inverted first count signal; and (d) an OR gate, the inputs of which are connected respectively to the outputs of said first and second AND gates, the output of which emits said test shift pattern.

14. The arrangement according to claim 13 wherein said transfer control means includes a transfer element for each individual cell of said storage means, said transfer element being adapted upon receipt of said transfer control signal to transfer the value resident in a particular storage means cell i therefrom to said corresponding position i in said display means if the value associated with it is in a position i-p to the right of said data transition, where the value p is an integer between K and n+K and the value n is an integer equal to $L_{max}$.

15. The arrangement according to claim 14 wherein said transfer element associated with the first display means position has three input lines associated respectively with the first three storage means positions, the first of which is connected to the input of a third AND gate, the second of which is connected to the input of a second inverter whose output is connected to the other input of said third AND gate, and the third of which is connected to an input of a fourth AND gate, the other inputs of said fourth AND gate being connected respectively to the output of said third AND gate and to receive said transfer control signal, the output of said fourth AND gate being connected to the first display means position and the output of said third AND gate being also connected to an output line for communication with the remainder of said transfer elements whereby said transfer elements are notified of the presence of a data transition detected by said third AND gate, which transition causes the third input line to transfer information associated with its corresponding storage means position to the corresponding display means position if this position is on the right of a data transition.

16. The arrangement according to claim 15 wherein all of the others of said transfer elements have three input lines each which are associated respectively with succeeding storage means positions and which transfer elements are each interconnected to third and fourth AND gates in an identical manner to said first transfer element and which further includes an OR gate, associated with each of said other transfer elements, one input of which is connected to said output line of said third AND gate associated with the preceding transfer element and the other input of which is connected to the output of its own associated third AND gate and the output of which is connected to an input of its own associated fourth AND gate and to an input of the third AND gate of the immediate succeeding transfer element.

17. The arrangement according to claim 2 wherein said transfer control means includes a transfer element for each individual cell of said storage means, said transfer element being adapted upon receipt of said transfer control signal to transfer the value resident in a particular storage means cell i therefrom to said corresponding position i in said display means if the value associated with it is in a position i-p to the right of said data transition, where the value p is an integer between K and n+K and the value n is an integer equal to $L_{max}$.

18. The arrangement according to claim 17 wherein said transfer element associated with the first display means position has three input lines associated respectively with the first three storage means positions, the first of which is connected to the input of a third AND gate, the second of which is connected to the input of a second inverter whose output is connected to the other input of said third AND gate, and the third of which is connected to an input of a fourth AND gate, the other inputs of said fourth AND gates being connected respectively to the output of said third AND gate and to receive said transfer control signal, the output of said fourth AND gate being connected to the first display means position and the output of said third AND gate being also connected to an output line for communication with the remainder of said transfer elements whereby said transfer elements are notified of the presence of a data transition detected by said third AND gate, which transition causes the third input line to transfer information associated with its corresponding storage means position to the corresponding display means position if this position is on the right of a data transition.

19. The arrangement according to claim 18 wherein all of the others of said transfer elements have three input lines each which are associated respectively with succeeding storage means positions and which transfer elements are each interconnected to third and fourth AND gates in an identical manner to said first transfer element and which further includes an OR gate, associated with each of said other transfer elements, one input of which is connected to said output line of said third AND gate associated with the preceding transfer element and the other input of which is connected to the output of its own associated third AND gate and the output of which is connected to an input of its own associated fourth AND gate and to an input of the third AND gate of the immediate succeeding transfer element.

* * * * *